(12) United States Patent
Sugawara

(10) Patent No.: US 12,542,261 B2
(45) Date of Patent: Feb. 3, 2026

(54) SUBSTRATE PROCESSING APPARATUS

(71) Applicant: Tokyo Electron Limited, Tokyo (JP)

(72) Inventor: Eiichi Sugawara, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 871 days.

(21) Appl. No.: 17/713,232

(22) Filed: Apr. 5, 2022

(65) Prior Publication Data

US 2022/0230857 A1 Jul. 21, 2022

Related U.S. Application Data

(60) Division of application No. 16/214,731, filed on Dec. 10, 2018, now Pat. No. 11,328,910, which is a
(Continued)

(30) Foreign Application Priority Data

Mar. 31, 2011 (JP) ................................. 2011-079859

(51) Int. Cl.
*H01J 37/32* (2006.01)
*H01L 21/673* (2006.01)
(Continued)

(52) U.S. Cl.
CPC .. *H01J 37/32899* (2013.01); *H01J 37/32642* (2013.01); *H01L 21/67346* (2013.01);
(Continued)

(58) Field of Classification Search
CPC ......... H01L 21/67167; H01L 21/67184; H01L 21/67196; H01L 21/67259;
(Continued)

(56) References Cited

U.S. PATENT DOCUMENTS

| | | |
|---|---|---|
| 4,534,389 A | 8/1985 | Tullis |
| 6,225,233 B1 | 5/2001 | Seo et al. |

(Continued)

FOREIGN PATENT DOCUMENTS

| | | |
|---|---|---|
| JP | 2008-226509 A | 9/2008 |
| JP | 2009-016447 A | 1/2009 |

(Continued)

*Primary Examiner* — Benjamin Kendall
(74) *Attorney, Agent, or Firm* — XSENSUS LLP

(57) ABSTRACT

Provided is a substrate processing apparatus, including: transportation chamber maintained in an atmospheric environment where a substrate is transported; a vacuum processing chamber connected with the transportation chamber through a load lock chamber; a substrate placing table installed in the vacuum processing chamber and having a body part and a surface part that is attachable to/detachable from the body part; a storage unit installed in the load lock chamber or the transportation chamber and configured to receive the surface part; and a transportation mechanism configured to transport the substrate from the transportation chamber to the vacuum processing chamber through the load lock chamber and transport the surface part between the storage unit and the body part of the vacuum processing chamber.

24 Claims, 20 Drawing Sheets

Related U.S. Application Data continuation of application No. 15/677,587, filed on Aug. 15, 2017, now Pat. No. 10,224,226, which is a division of application No. 13/434,255, filed on Mar. 29, 2012, now Pat. No. 9,799,542.

(60) Provisional application No. 61/477,639, filed on Apr. 21, 2011.

(51) Int. Cl.
  *H01L 21/677* (2006.01)
  *H01L 21/68* (2006.01)
  *H01L 21/687* (2006.01)

(52) U.S. Cl.
  CPC ...... *H01L 21/681* (2013.01); *H01L 21/68728* (2013.01); *H01L 21/68742* (2013.01); *H01L 21/67748* (2013.01)

(58) Field of Classification Search
  CPC ......... H01L 21/67265; H01L 21/67346; H01L 21/67748; H01L 21/67763; H01L 21/67766; H01L 21/67769; H01L 21/67778; H01L 21/68; H01L 21/681; H01L 21/6831; H01L 21/68714; H01L 21/68728; H01L 21/68742; H01J 37/32642; H01J 37/32697; H01J 37/32715; H01J 37/32899
  See application file for complete search history.

(56) References Cited

U.S. PATENT DOCUMENTS

| | | |
|---|---|---|
| 6,409,896 B2 | 6/2002 | Crocker |
| 2005/0205209 A1 | 9/2005 | Mosden |
| 2008/0057728 A1 | 3/2008 | Shimura et al. |
| 2009/0181553 A1 | 7/2009 | Koelmel et al. |
| 2011/0031111 A1 | 2/2011 | Kobayashi |
| 2011/0147618 A1 | 6/2011 | Zhang |

FOREIGN PATENT DOCUMENTS

| | | |
|---|---|---|
| JP | 2011-054933 A | 3/2011 |
| KR | 100239254 B1 | 3/2000 |

SUBSTRATE PROCESSING APPARATUS

CROSS-REFERENCE TO RELATED APPLICATIONS

This application is a divisional of U.S. application Ser. No. 16/214,731, filed Dec. 10, 2018, which is a continuation of U.S. patent application Ser. No. 15/677,587, filed on Aug. 15, 2017 (now U.S. Pat. No. 10,224,226), which is a divisional of U.S. patent application Ser. No. 13/434,255, filed on Mar. 29, 2012 (now U.S. Pat. No. 9,799,542), which claims priority from U.S. Provisional Application No. 61/477,639, filed Apr. 21, 2011, with the United States Patent and Trademark Office and claims the benefit of priority of the Japanese Patent Application No. 2011-079859, filed on Mar. 31, 2011, with the Japan Patent Office, the entire disclosure of each of which are incorporated herein by reference.

TECHNICAL FIELD

The present disclosure relates to a substrate processing apparatus including a vacuum processing chamber, a substrate transportation chamber in an atmospheric pressure environment, and a load lock chamber.

BACKGROUND

In a process of forming a wire structure, there is a case of performing plasma etching to form a damascene-structure concave portion constituted by a groove or a via hole on various layers formed on, for example, a semiconductor wafer ("wafer").

A plasma etching apparatus that performs the plasma etching process is configured, for example, by placing an upper electrode and a placing table serving as a lower electrode in a processing chamber under a vacuum state. While the wafer is placed in the placing table, plasma is generated and ions are injected into the placing table by applying a high-frequency power at a predetermined frequency to the upper electrode and the placing table through a matching unit to thereby perform an etching process. An electrostatic chuck in which the wafer is placed on the surface thereof and a focus ring surrounding an outer periphery of the wafer placed in the electrostatic chuck are installed in the placing table. The electrostatic chuck serves to control the temperature of the wafer by adsorbing the wafer and transferring heat to the wafer. The focus ring is installed to distribute plasma on the surface of the wafer with high uniformity and etched together with the wafer by the ions.

However, the electrostatic chuck and the wafer have different thermal expansion coefficients, such that when the wafer is placed on the electrostatic chuck, the electrostatic chuck and the wafer rub against each other due to the difference between the thermal expansion coefficients. As a result, when the processing of the wafer is repeatedly continued, the surface of the electrostatic chuck is gradually planarized to increase a contact area between the placing table and the wafer, such that a transfer rate of heat to the wafer is changed, and as a result, an etching characteristic of the wafer is changed. Further, when the etching process of the wafer is repeatedly performed, the focus ring is also etched, and as a result, the shape of the corresponding focus ring is gradually changed. The change in the shape results in changing an injection direction of the ions or a formation state of an electric field, thereby changing the etching characteristic of the wafer.

In order to remove an adherend attached to a wall surface or the placing table within the processing chamber after etching, cleaning may be performed, in which a gas supplied into the processing chamber turned into plasma to remove the adherend. Protecting the electrostatic chuck by placing a dummy wafer on the electrostatic chuck has been considered in the cleaning. However, it has been considered that the cleaning is performed without using the dummy wafer in order to save time or reduce the cost required to transport the dummy wafer into the processing chamber. However, when the dummy wafer is not placed as such, the surface of the electrostatic chuck may be chamfered by the cleaning, such that the transfer rate of the heat to the wafer is changed, thus, the etching characteristic of the wafer is changed.

As such, the state of the surface of the electrostatic chuck and the shape of the focus ring are changed due to the consumption resulting from the etching process, and as a result, the etching characteristic is changed. Therefore, a precise state management is required. When the shape is out of an allowable range, an action such as an immediate replacement is needed.

However, since the electrostatic chuck and the focus ring are installed in the vacuum state as described above, installing a sensor in the processing chamber is considered in order to check the states of the electrostatic chuck and the focus ring in the vacuum state. However, plasma may be misaligned due to the installation of the sensor. Therefore, based on a tendency of the change in the state of the surface of the electrostatic chuck and the shape of the focus ring in the related art, usable durations (life-spans) of the electrostatic chuck and the focus ring are set, and when a plasma etching duration exceeds the set durations, the processing chamber is opened to the atmosphere to replace the electrostatic chuck and the focus ring. Further, when the change in etching characteristic in the wafer is verified, the processing chamber is opened and the states of the electrostatic chuck and the focus ring are checked. When the shape is out of the allowable range, the electrostatic chuck and the focus ring may be replaced.

However, since the change degrees in the shapes of the electrostatic chuck and the focus ring are different according to the difference in etching conditions, it is difficult to manage the states of the electrostatic chuck and the focus ring precisely by using a technique of setting the usable durations as described above. In the technique of verifying the change in etching characteristic of the wafer, and thereafter, replacing the electrostatic chuck and the focus ring, the wafer is wasted. As a result, it is difficult to acquire the stable etching characteristic over a long period. In the technique, since the processing chamber is opened to the atmosphere when replacing the electrostatic chuck and the focus ring, an etching process cannot be accomplished until a desired vacuum degree is acquired by vacuum-exhausting the processing chamber after the processing chamber is opened to the atmosphere. Therefore, productivity of the plasma etching apparatus may deteriorate. Japanese Patent Application Laid-Open No. 2009-16447 discloses a substrate processing apparatus having the plasma etching apparatus, but a technique of solving the problem is not disclosed.

SUMMARY

An exemplary embodiment of the present disclosure provides a substrate processing apparatus, including: a transportation chamber maintained in an atmospheric environment where a substrate is transported; a vacuum processing chamber connected with the transportation chamber through a load lock chamber to perform a vacuum processing of the substrate; a substrate placing table installed in the vacuum processing chamber and having a body part and a surface part that is attachable to/detachable from the body part; a storage unit installed in the load lock chamber or the transportation chamber and configured to receive the surface pan; and a transportation mechanism configured to transport the substrate from the transportation chamber to the vacuum processing chamber through the load lock chamber and transport the surface part between the storage unit and the body part of the vacuum processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
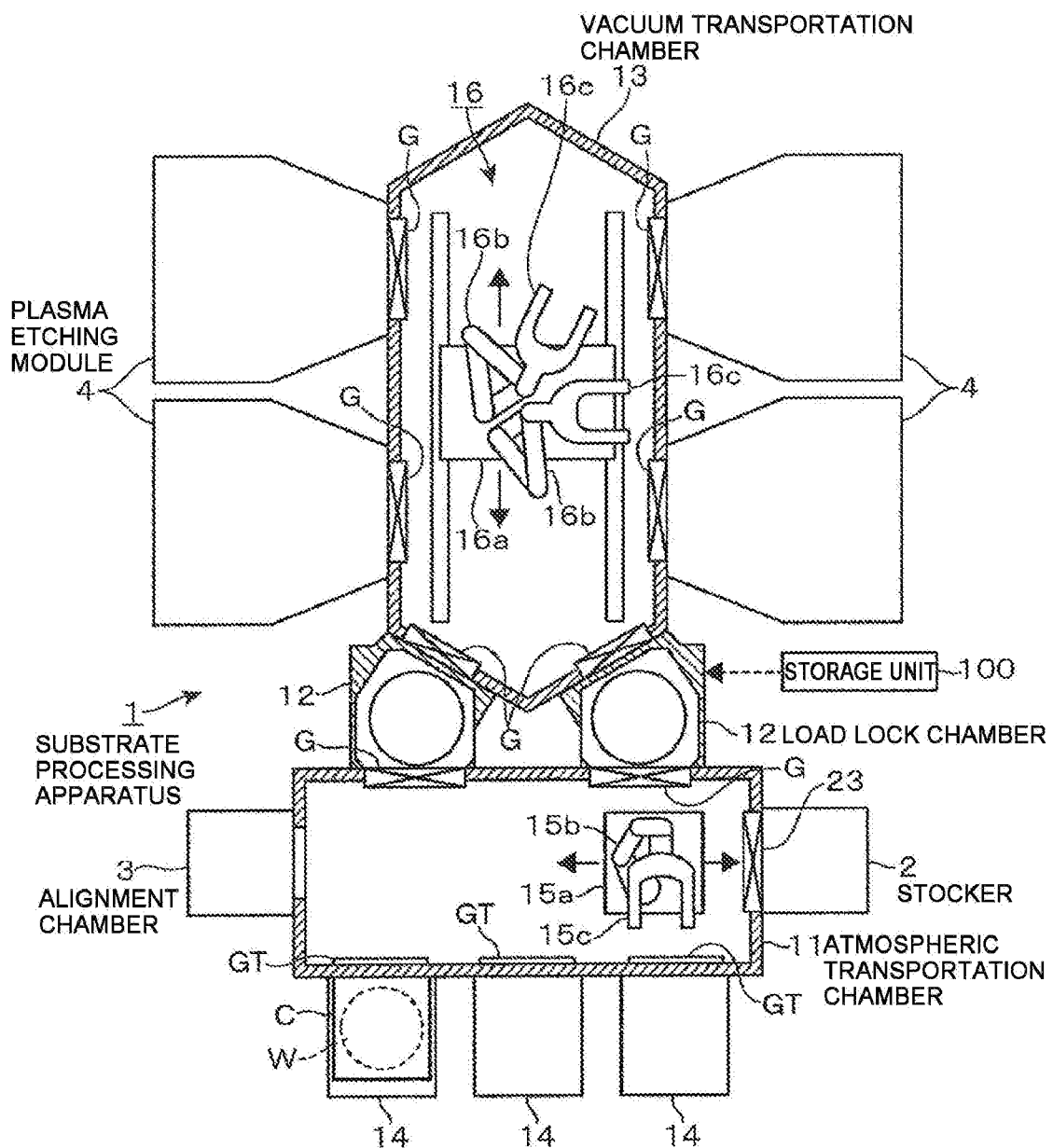
FIG. 1 is a longitudinal side view of a substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to check a state of a surface part of a substrate placing table installed in a vacuum processing chamber or shorten a stop time of vacuum processing by replacing the corresponding surface part and manage the state of the surface part precisely.

An exemplary embodiment of the present disclosure provides a substrate processing apparatus, including: a transportation chamber maintained in a atmospheric environment where a substrate is transported; a vacuum processing chamber connected with the transportation chamber through a load lock chamber to perform vacuum processing of the substrate; a substrate placing table installed in the vacuum processing chamber and having a body part and a surface part that is attachable to/detachable from the body part; a storage unit installed in the load lock chamber or the transportation chamber and configured to receive the surface part; and a transportation mechanism configured to transport the substrate from the transportation chamber to the vacuum processing chamber through the load lock chamber and transport the surface part between the storage unit and the body part of the vacuum processing chamber.

Detailed aspects of the present disclosure are as follows.

(1) A vacuum transportation chamber in a vacuum state interposed between the load lock chamber and the vacuum processing chamber is installed.

(2) The storage unit is partitioned from the load lock chamber and the vacuum processing chamber to be connected to the vacuum transportation chamber, instead of being installed in the load lock chamber or the transportation chamber, and the substrate processing apparatus further includes a gate valve configured to switch opening/closing of the storage unit with respect to the vacuum transportation chamber so that the inside of the storage unit is converted from a vacuum state to an atmospheric environment while the vacuum transportation chamber is in the vacuum state.

(3) The surface part has a placement surface where the substrate is placed, the storage unit has a holding unit for holding the surface part, and the transportation mechanism transports the substrate from the storage unit to a vacuum processing chamber while placing the substrate in the surface part.

(4) An alignment mechanism aligning the holding unit before transporting the surface part and the substrate to the holding unit is installed in order to place the substrate at a predetermined position of the placement surface.

(5) The vacuum processing chamber is used to plasma-process the substrate.

(6) The surface part includes at least one of an electrostatic chuck for adsorbing the substrate and a focus ring for surrounding an outer periphery of the substrate and controlling a state of plasma.

(7) The storage unit includes a first storage unit and a second storage unit that are partitioned from each other, and the gate valve is installed in each of the first storage unit and the second storage unit and is configured to be opened/closed independently from each other.

According to exemplary embodiments of the present disclosure, a surface part of a substrate placing table installed in a vacuum processing chamber is configured to be attachable to/detachable from a body portion and installed in a load lock chamber or an atmospheric transportation chamber or transported to and from a storage unit connected to a vacuum transportation chamber. Therefore, since the surface part can be replaced even though the vacuum processing chamber is not opened to the atmosphere, a halt time of vacuum processing in the vacuum processing chamber can be impeded. Further, a state of the surface part can be checked with the naked eye or the state of the surface part can be checked by installing various sensors in the storage unit. Therefore, the state of the surface part can be precisely managed, and furthermore, an etching characteristic of a substrate can be prevented from deteriorating.

First Exemplary Embodiment

The configuration of a substrate processing apparatus 1 according to an exemplary embodiment of the present disclosure will be described with reference to a plan view of FIG. 1. Substrate processing apparatus 1 includes an atmospheric transportation chamber 11 that carries a wafer W as a substrate for fabricating a semiconductor device into substrate processing apparatus 1, load lock chambers 12, 12, a vacuum transportation chamber 13, and for example, four plasma etching modules 4. Atmospheric transportation chamber 11 is connected to vacuum transportation chamber 13 through load lock chambers 12, 12. Plasma etching modules 4 are connected to vacuum transportation chamber 13 to be partitioned from load lock chambers 12, 12.

Atmospheric transportation chamber 11 is configured in an atmospheric environment, and a carrier placing table 14 in which a carrier C storing, for example, twenty five sheets of wafers W is placed is installed on a front surface of atmospheric transportation chamber 11. A gate door GT which is opened/closed together with a cover of carrier C in connection with carrier C is installed on a front wall of atmospheric transportation chamber 11. A stocker 2 serving as a storage unit is installed on one side of atmospheric transportation chamber 1 and an alignment chamber 3 configuring an alignment mechanism is installed on the other side. Stocker 2 and alignment chamber 3 will be described below.

A first transportation mechanism 15 is installed in atmospheric transportation chamber 11, and wafer W and an electrostatic chuck 51 and a focus ring 52 as described below are transferred among carrier C, load lock chamber 12, alignment chamber 3 and stocker 2. First transportation mechanism 15 includes a base portion 15a, a multi-link arm 15b and a support portion 15c. A base end of arm 15b is connected to base portion 15a, and a front end of arm 15b is connected to support portion 15c. Base portion 15a is movable horizontally, and further, is configured to be elevatable. Support portion 5c has a U shape in a planar view and supports wafer W, electrostatic chuck 51 and focus ring 52.

A stage, in which wafer W is placed, and elevatable support pins are installed in load lock chamber 12, and wafer W may be transferred between first transportation mechanism 15 and a second transportation mechanism 16 as described below by the support pins. A vacuum pump and a leak valve (not shown) are installed in load lock chamber 12 to switch an atmospheric environment and a vacuum environment to each other. That is, since the environments of atmospheric transportation chamber 11 and vacuum transportation chamber 13 are maintained as the atmospheric environment and the vacuum environment, respectively, atmospheres of load lock chambers 12, 12 are switched in order to transport wafer W between the transportation chambers.

Vacuum transportation chamber 13 is maintained in the vacuum environment as described above and has second transportation mechanism 16. Second transportation mechanism 16 is configured substantially similar to first transportation mechanism 15, but two arms and support portions are installed in one base portion. A base portion, arms and support portions of second transportation mechanism 16 are represented by 16a, 16b and 16c, respectively.

G in the figure represents an openable/closable gate valve (partition valve) partitioning between the respective chambers and between plasma etching modules 4 and the vacuum transportation chamber. In general, gate valve G is closed, and is opened when wafer W is transported between the respective chambers and between each module and vacuum transportation chamber 13.

Next, stocker 2 will be described with reference to a longitudinal cross-sectional view of FIG. 2 and a transverse plan view of FIG. 3. Stocker 2 has a case 21, and an opening portion 22 through which first transportation mechanism 15 enters and a shutter 23 that opens/closes opening portion 22 are installed in case 21. Several electrostatic chucks 51 and focus rings 52 constituting placing table 43 of wafer W in plasma etching module 4 are received in case 21. A side wall 21a configuring case 21 and installed at an opposite side to atmospheric transportation chamber 11 is configured to, for example, be transparent for a user to check the states of electrostatic chuck 51 and focus ring 52 with naked eyes. Side wall 21a is configured to be attachable/detachable and enables electrostatic chuck 51 and focus ring 52 in case 21 to be replaced.

Herein, configurations of electrostatic chuck 51 and focus ring 52 will be described with reference to a perspective view of FIG. 4. Electrostatic chuck 51 serves to place and adsorptively hold wafer W and transfer heat to wafer W during processing in plasma etching module 4, and has a disk shape. A step portion is formed on the surface thereof, and a center 511 is higher than a periphery 512. A hole 513 penetrated by support pins 27 as described below, and a hole 514 for circulating gas to a rear surface of wafer W during processing wafer W are formed at center 511 in a thickness direction of electrostatic chuck 51. A hole 515 penetrated by support pins 28 as described below is provided at the periphery 512 in the thickness direction. Holes 513, 515 are arranged three by three in a peripheral direction of electrostatic chuck 51. A plurality of holes 514 are installed.

Reference numeral 516 in the figure represents a notch formed toward the inside from an outer periphery of electrostatic chuck 51.

Focus ring 52 is made of, for example, silicon as in wafer W, serves to prevent the state of plasma from being misaligned at the periphery and the center of wafer W during processing in plasma etching module 4, and has a ring shape. A step is formed on the surface of focus ring 52 and an outer periphery 522 is higher than an inner periphery 521. The material of focus ring 52 is not limited to silicon, and may be made of, for example, silicon dioxide ($SiO_2$) or silicon carbide (SiC). Focus ring 52 is configured to be placed on periphery 512 of electrostatic chuck 51. Outer periphery 522 of focus ring 52 has a size enough to surround an outer periphery of wafer W.

Figure 5:
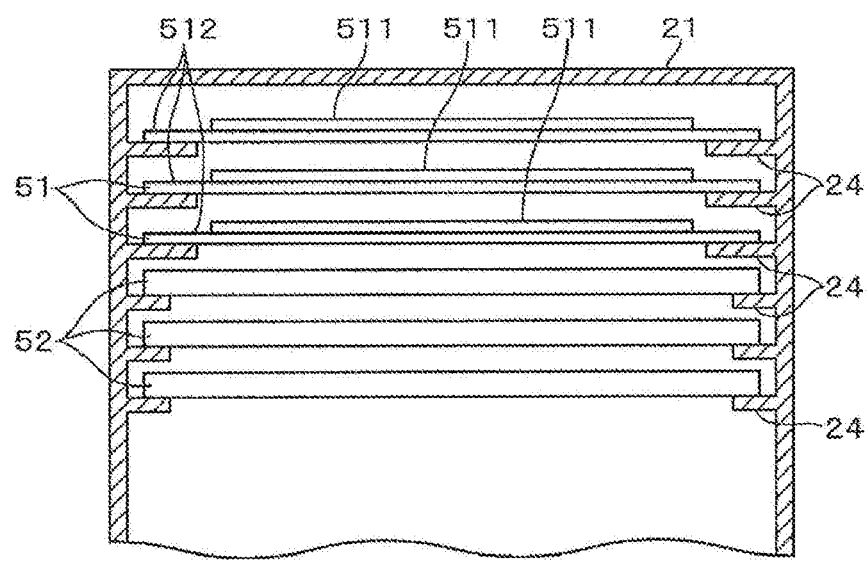
FIG. 5 is a perspective view of a placing table installed in the stocker.

Referring back to stocker 2, a rack 24 for stacking and supporting a plurality of electrostatic chucks 51 and focus ring 52 is installed in an upper part of case 21. FIG. 5 is a longitudinal cross-section view acquired by viewing the upper part of case 21 from opening portion 22 of case 21. As shown in FIG. 5, rack 24 is horizontally installed seen from opening portion 22, and supports edges of electrostatic chuck 51 and focus ring 52. First transportation mechanism 15 that enters through opening portion 22 supports rear surfaces of electrostatic chuck 51 and focus ring 52, and may receive electrostatic chuck 51 and focus ring 52 from corresponding rack 24.

Figure 2:
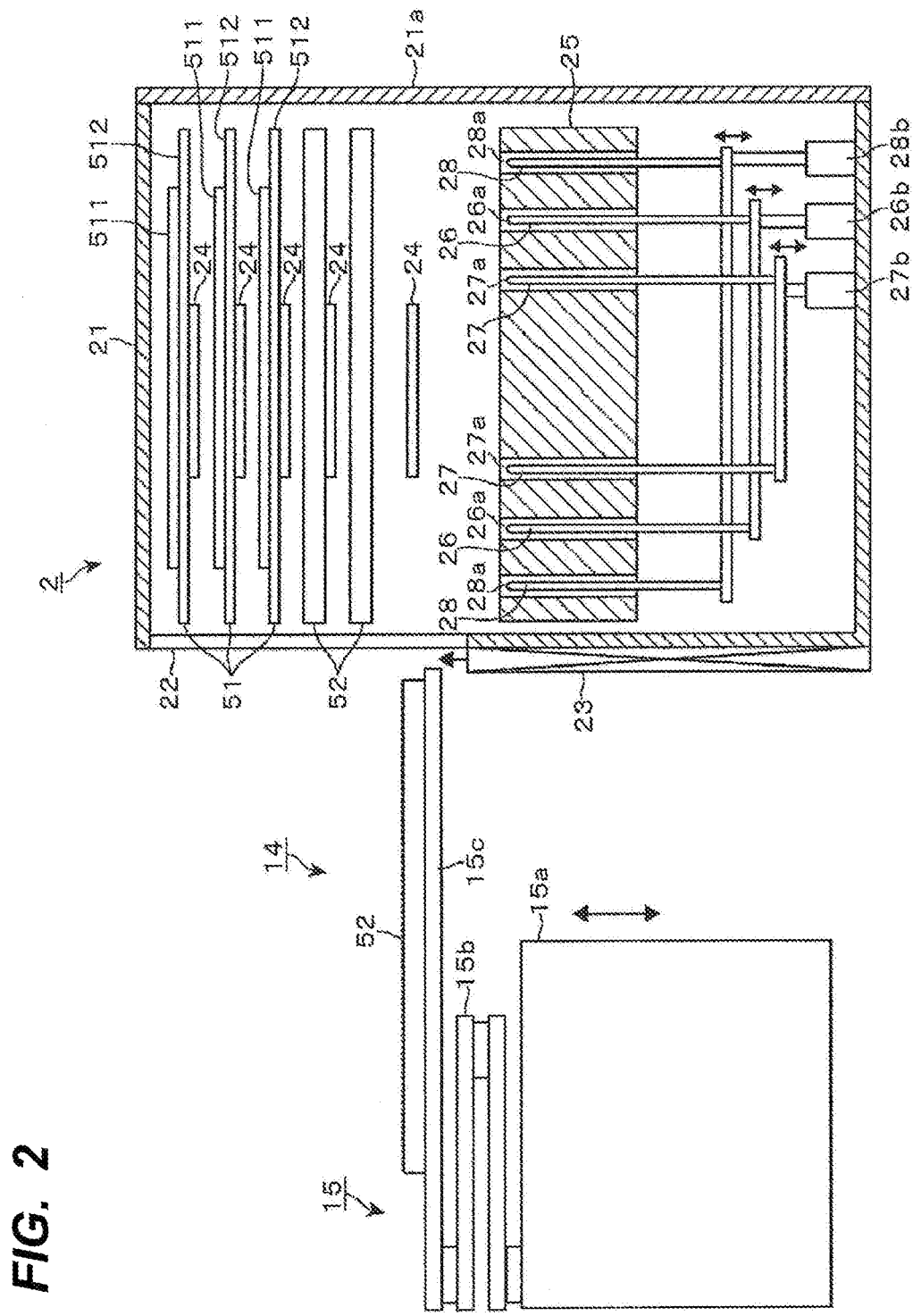
FIG. 2 is a longitudinal side view of a stocker installed in the substrate processing apparatus.
Figure 3:
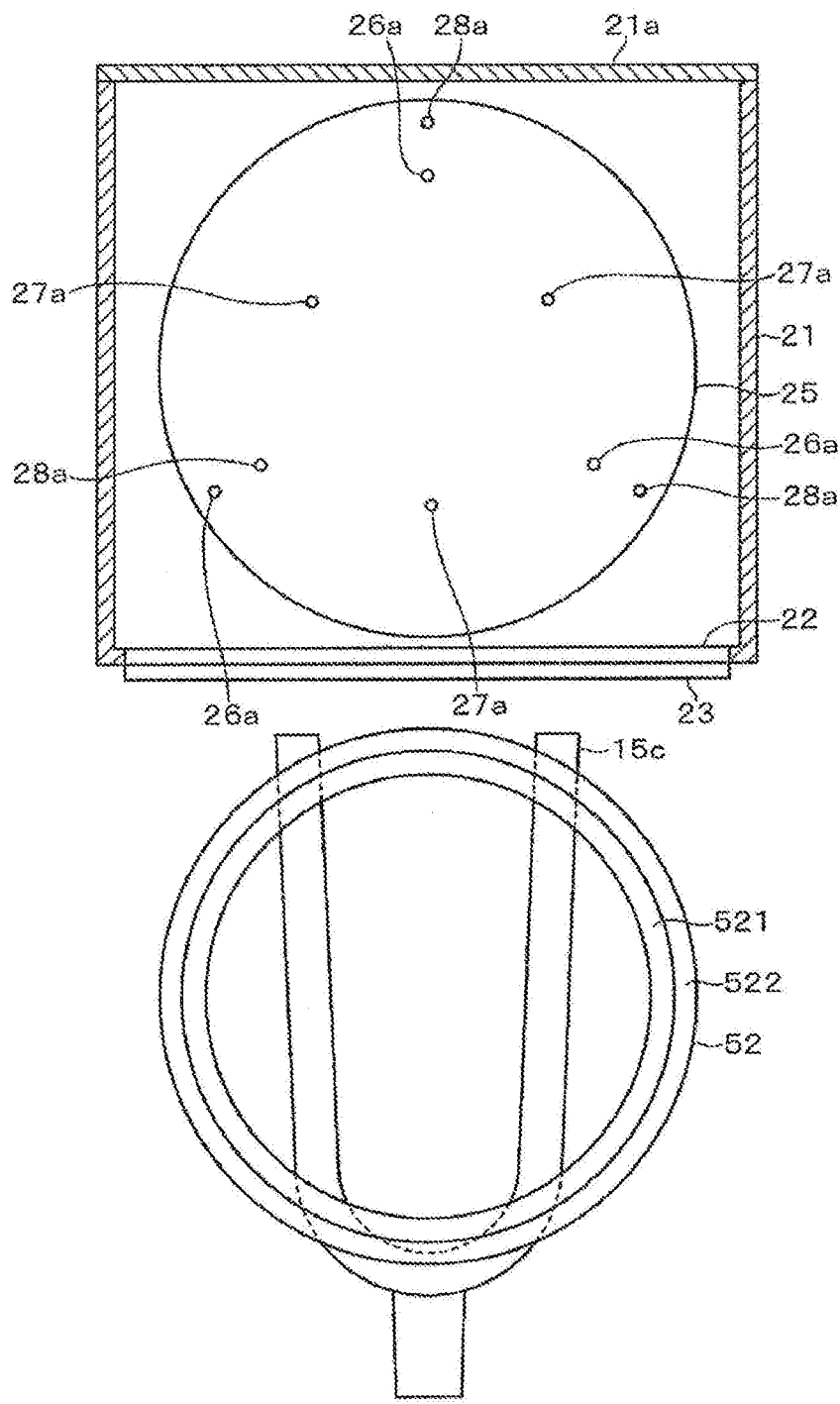
FIG. 3 is a longitudinal front view of an upper part of the stocker.
Figure 4:
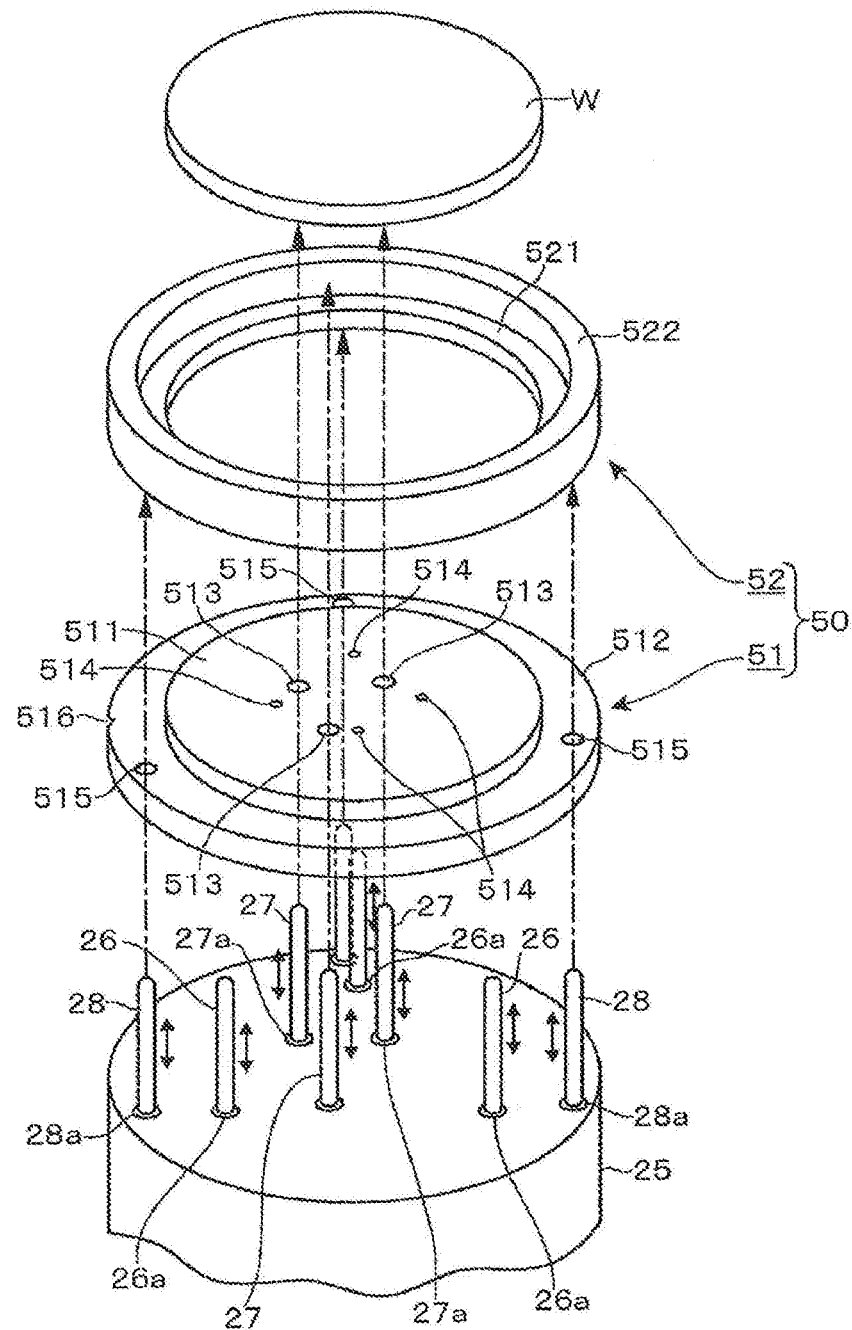
FIG. 4 is a transverse plan view of the stocker.

A circular holding unit 25 is installed below rack 24 as shown in FIGS. 2 to 4. Electrostatic chuck 51 and focus ring 52, and wafer W that is transported from carrier C, are transported to holding unit 25 to be integrated with each other. The integrated members are transported to plasma etching module 4 by first transportation mechanism 15 and second transportation mechanism 16. Three holes 26*a* (only two are shown in FIG. 2 for convenience) that are formed in a thickness direction of holding unit 25 are placed in a circumferential direction of holding unit 25. Support pins 26 supporting the rear surface of electrostatic chuck 51 are installed in each hole 26*a*, and each support pin 26 is configured to be elevatable by a driving mechanism 26*b* shown in FIG. 2.

Three holes 27*a* are placed more inward on holding unit 25 than holes 26*a*, in the same manner as holes 26*a* are placed. Support pins 27 are installed in each hole 27*a*, and each support pin 27 is configured to be elevatable by a driving mechanism 27*b*. As shown in FIG. 4, support pins 26 support the rear surface of wafer W through hole 513 of electrostatic chuck 51. Three holes 28*a* are placed more outward on holding unit 25 than holes 26*a*, in the same manner as holes 26*a* are placed. Support pins 28 are installed in each hole 28*a*, and each support pin 28 is configured to be elevatable by a driving mechanism 28*b*. As shown in FIG. 4, support pins 28 support the rear surface of focus ring 52 through hole 515 of electrostatic chuck 51.

Figure 6:
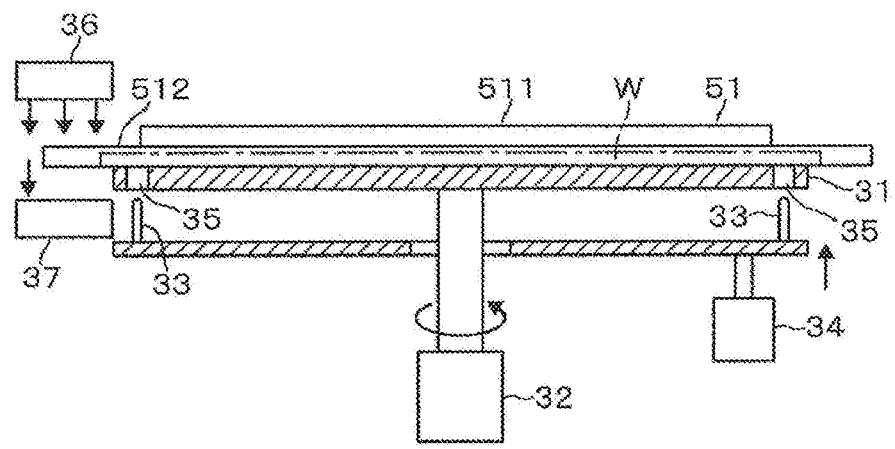
FIG. 6 is a longitudinal side view of an alignment module installed in the substrate processing apparatus.
Figure 7:
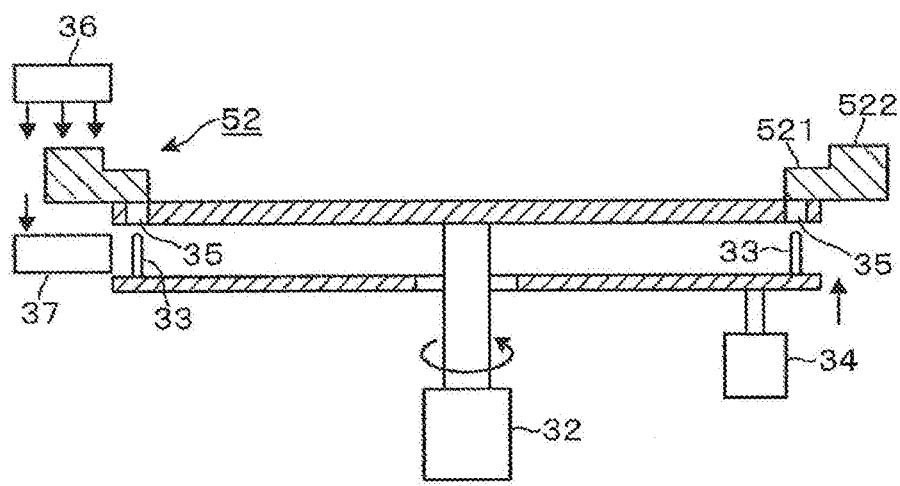
FIG. 7 is a longitudinal side view of an alignment module installed in the substrate processing apparatus.

Referring to FIGS. 6 and 7, the configuration of alignment chamber 3 will be described. A horizontal rotation stage 31 where wafer W, electrostatic chuck 51 and focus ring 52 are placed, respectively, is installed in alignment chamber 3. Rotation stage 31 vacuum-adsorbs and horizontally supports wafer W, electrostatic chuck 51 and focus ring 52. FIG. 6 illustrates a state in which electrostatic chuck 51 is placed in rotation stage 31, and FIG. 7 illustrates a state in which focus ring 52 is placed in rotation stage 31.

Rotation stage 31 is rotated around a vertical axis while maintaining a horizontal state by a driving mechanism 32. For example, three (only two are shown in the figure for convenience) support pins 33 are installed in a circumferential direction of rotation stage 31 below rotation stage 31. Support pins 33 are elevated by an elevation mechanism 34 to protrude on rotation stage 31 through a hole 35 provided in a thickness direction of rotation stage 31. Wafer W, electrostatic chuck 51 and focus ring 52 are transferred between rotation stage 31 and first transportation mechanism 15 by support pins 33.

A light transmitting unit 36 is installed in an outer upper part of rotation stage 31, and a light receiving unit 37 is installed therebelow. As shown in FIG. 6, while rotation stage 31 where electrostatic chuck 51 is placed rotates, light transmitting unit 36 transmits light to light receiving unit 37. Based on a change in the amount of light which is not blocked by the periphery of electrostatic chuck 51 but projected to light receiving unit 37, a control unit 100 as described below detects a center position of electrostatic chuck 51 on rotation stage 31 and a direction of a notch 516, and places notch 516 in a predetermined direction by rotating rotation stage 31. Control unit 100 may detect the center position of wafer W by performing the same processing even with respect to wafer W. Control unit 100 detects a center position of focus ring 52 by performing the same processing with respect to focus ring 52 as well.

First transportation mechanism 15 receives each member where the center position is detected and the direction is adjusted as described above so that the detected center position is positioned at a predetermined position with respect to support portion 15*c* of first transportation mechanism 15. By transferring electrostatic chuck 51 as such, the aforementioned position of each hole and position of each support pin of holding unit 25 are aligned when the electrostatic chuck is placed in holding unit 25. When electrostatic chuck 51 is transported to plasma etching module 4, the position of hole 513 in electrostatic chuck 51, the position of an electrode 518 on the bottom of electrostatic chuck 51 as described below, and the position of hole 514 for circulating gas may be aligned with respect to the position of support pins 46 of a body part 44, the position of a surface electrode 531, and the position of a gas ejection hole 48, respectively, which are described below. That is, when the positions are aligned with respect to support portion 15*c*, the positions are aligned with respect to holding unit 25 and plasma etching module 4 as well. Focus ring 52 and wafer W are also transferred based on the center position as described above to be accurately placed in electrostatic chuck 51.

Figure 8:
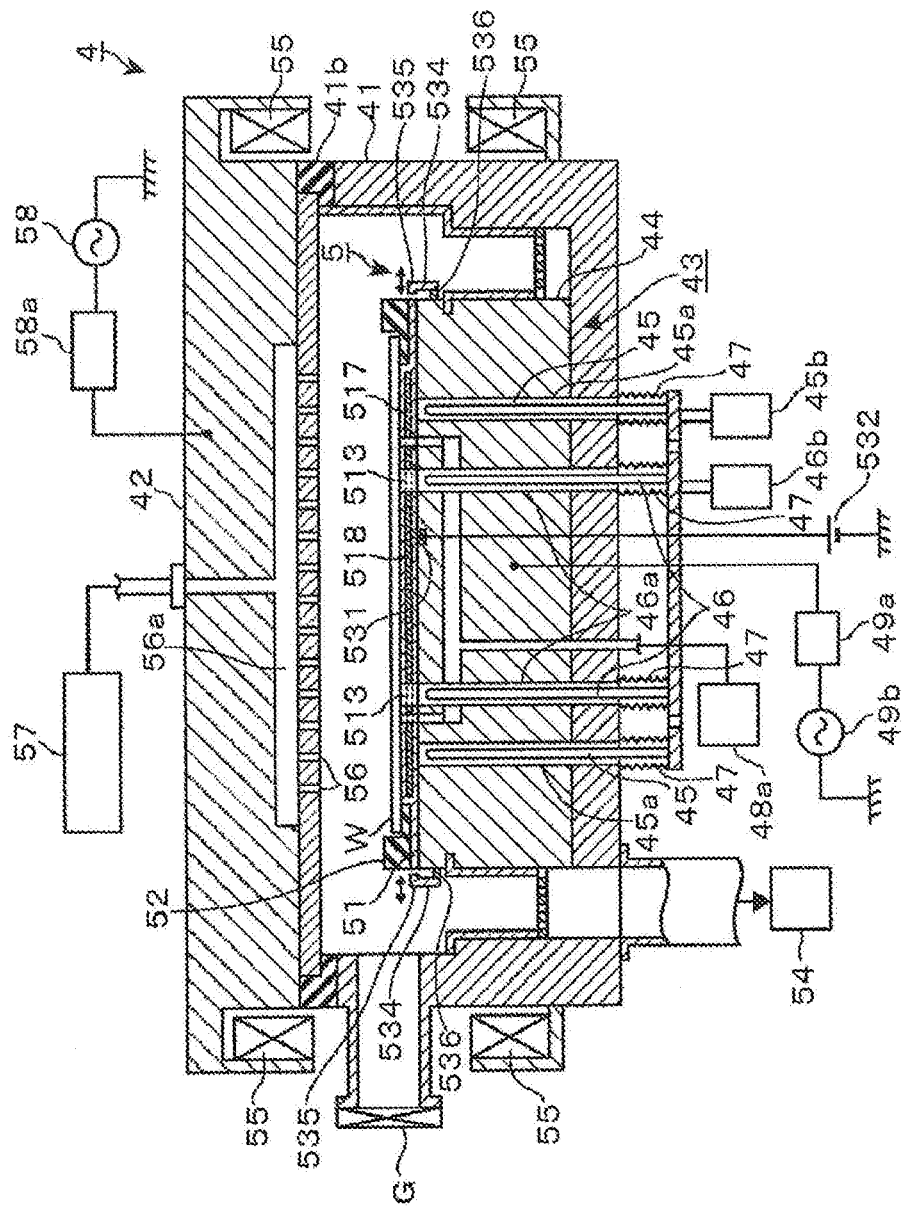
FIG. 8 is a longitudinal side view of a plasma etching module installed in the substrate processing apparatus.

Next, plasma etching module 4 will be described with reference to a longitudinal side view of FIG. 8. Plasma etching module 4 is a magnetron type reactive ion etching apparatus. Plasma etching module 4 includes an airtight processing chamber 41. In processing chamber 41, an upper electrode 42 which also serves as a gas shower head for introducing processing gas for etching and a placing table 43 which also serves as a lower electrode are installed in opposition to each other.

Figure 9:
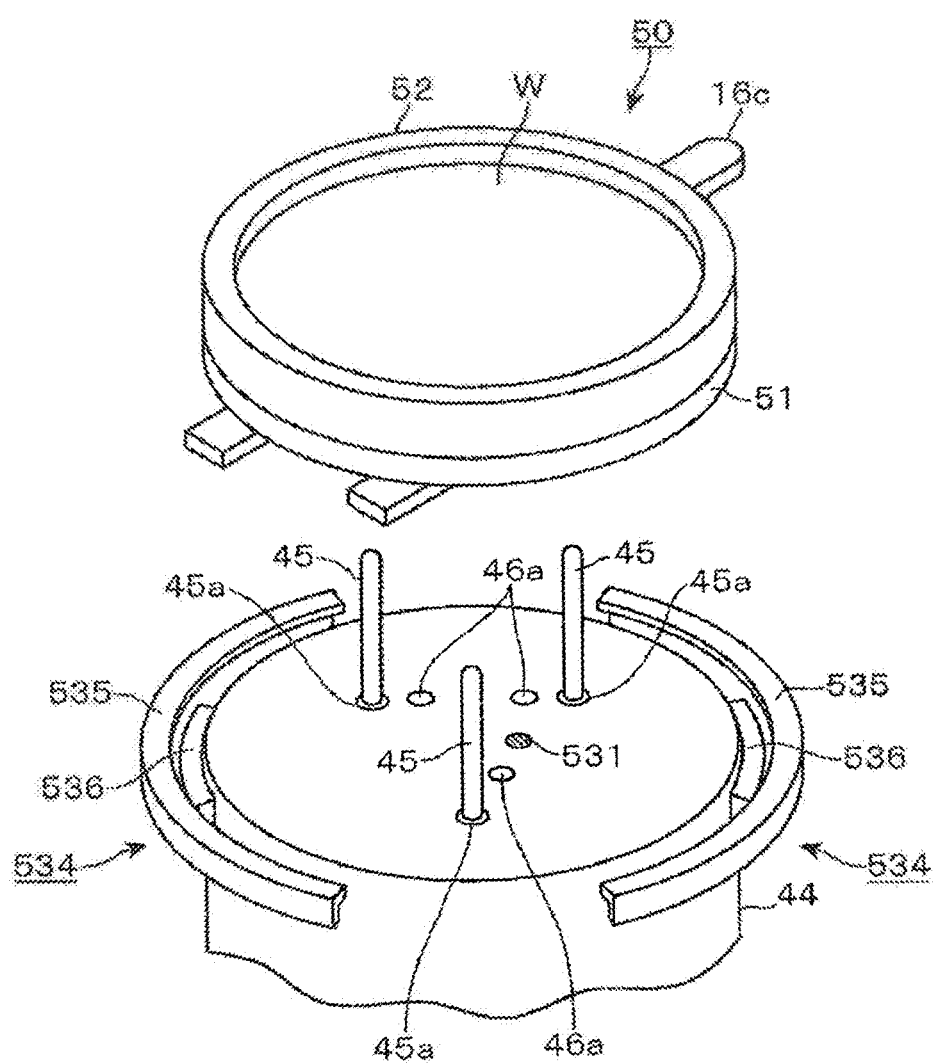
FIG. 9 is a perspective view of a placing table installed in the plasma etching module.

Placing table 43 is constituted by, for example, circular body part 44, and electrostatic chuck 51 and focus ring 52 as described above, and electrostatic chuck 51 and focus ring 52 are installed on the surface of body part 44. Three holes 45*a* are formed in body part 44 in a thickness direction of body part 44 (only two are shown in FIG. 8 for convenience) and respective holes 45*a* are arranged in a circumferential direction of body part 44. Support pins 45 are installed in each of holes 45*a*, and are configured to be elevatable by a driving mechanism 45*b* installed below processing chamber 41. By this configuration, as shown in FIG. 9, wafer W, electrostatic chuck 51 and focus ring 52 that are integrated with holding unit 25 of stocker 2 are transferred between second transportation mechanism 16 and body part 44. Thereafter, wafer W, electrostatic chuck 51 and focus ring 52 that are integrated with each other are referred to as a target transport body 50.

Three holes 46*a* are formed in body part 44 in the thickness direction thereof, and holes 46*a* are arranged in a circumferential direction of body part 44 more inside body part 44 than holes 45*a*. Support pins 46 are installed in each of holes 46*a*, and are configured to be elevatable by an elevation mechanism 46*b* installed below processing chamber 41. While electrostatic chuck 51 and focus ring 52 are placed in body part 44, wafer W is pushed up by support pins 46 to transfer corresponding wafer W between second transportation mechanism 16 and placing table 43. Reference numeral 47 in FIG. 8 represents a bellows for keeping airtightness in processing chamber 41.

A heater (not shown) is installed in body part 44, and the temperature of wafer W is controlled by heat of the corresponding heater through electrostatic chuck 51. Gas ejection hole 48 connected to a heat transfer gas supplying unit 48*a* is installed in body part 44. The heat transfer gas composed of, for example, helium gas, which is ejected from gas ejection hole 48, is supplied to a minute gap between corresponding electrostatic chuck 51 and wafer W through hole 514 of electrostatic chuck 51 to perform a heat transfer to wafer W. A high-frequency power supply unit 49*b* applying bias power through matching unit 49*a* is connected to body part 44.

Herein, the configuration of body part 44 will be described while supplementing the configuration of electrostatic chuck 51. The surface of electrostatic chuck 51 is made of, for example, ceramics, and a plate-shaped main electrode 517 is installed therein. An extraction electrode 518 is installed downward from main electrode 517. Extraction electrode 518 is exposed to the bottom of electrostatic chuck 51. Surface electrode 531 is installed at a position of the surface of body part 44, which corresponds to extraction electrode 518, and surface electrode 531 is connected to a DC power supply 532. When electrostatic chuck 51 is placed in body part 44, extraction electrode 518 and surface electrode 531 are duplicated with each other and DC voltage is applied to main electrode 517 from DC power supply 532, such that wafer W is electrostatically adsorbed onto the surface of electrostatic chuck 51 by electrostatic force.

Pressing members 534 and 534 that form a pair are installed on the side of body part 44 with body part 44 interposed therebetween. Electrostatic chuck 51 is held between pressing members 534 to prevent electrostatic chuck 51 from floating by pressure of the aforementioned heat transfer gas. Pressing members 534 are formed such that an upper side of a standing plate installed on a side circumference of body part 44 is bent toward body part 44 at 90°. The upper side is shown as a pressing unit 535. A support member 536 that extends in a diameter direction of corresponding body part 44 to support pressing members 534 is installed on the side circumference of body part 44. Pressing unit 535 is moved in the diameter direction of body part 44 through support member 536 by a driving mechanism (not shown) installed in body part 44 to press and fix electrostatic chuck 51 horizontally.

Next, processing chamber 41 will be described. An exhaust pipe 53 is connected to the bottom of processing chamber 41, such that the inside of processing chamber 41 is vacuum-exhausted by a vacuum pump 54. A transport opening for transporting target transport body 50 is installed on a side wall of processing chamber 41 and opened/closed by gate valve G as described above. Magnet portions 55 and 55 formed by arranging, for example, a plurality of permanent magnets in the ring shape are vertically installed on an outer periphery of processing chamber 41 in order to form a predetermined magnetic field under a processing environment.

A plurality of gas ejection openings 56 are formed on the bottom of upper electrode 42, and is in communication with a buffer chamber 56*a* within upper electrode 42. Various gases supplied to buffer chamber 56*a* from a gas supplying unit 57 are ejected toward wafer W from gas ejection openings 56. A high-frequency power supply unit 58 for supplying high-frequency power through a matching unit 58*a* is connected to upper electrode 42. Reference numeral 41*b* in the figure represents an insulating member 41*b*, and insulates upper electrode 42 and the side wall of processing chamber 41 from each other.

Substrate processing apparatus 1 has control unit 100 that controls an operation of each unit. Control unit 100 includes a computer including, for example, a CPU and a program (not shown). In the program, a step (command) group is organized to transmit a control signal to each unit of substrate processing apparatus 1 in order to perform operations of substrate processing apparatus 1 as described below, such as transportation of wafer W, electrostatic chuck 51 and focus ring 52 by first transportation mechanism 15 and second transportation mechanism 16, alignment of these members in alignment chamber 3, and etching of wafer W in each module. This program is stored in storage media such as, for example, a hard disk, a compact disk, a magneto-optical disk and a memory card, and is installed in the computer therefrom.

The aforementioned operation of substrate processing apparatus 1 will be described. First, the inside of vacuum transportation chamber 13 and the inside of processing chamber 41 of each plasma etching module 4 are vacuum-exhausted and maintained to the vacuum state. First transportation mechanism 15 receives electrostatic chuck 51 from rack 24 of stocker 2, and transports received electrostatic chuck 51 to rotation stage 31 of alignment chamber 3. As described above, the center of electrostatic chuck 51 and the direction of notch 516 are detected, notch 516 faces a predetermined direction, and electrostatic chuck 51 is transferred to support portion 15*c* of first transportation mechanism 15 so that the detected center is positioned at a predetermined position.

Figure 10:
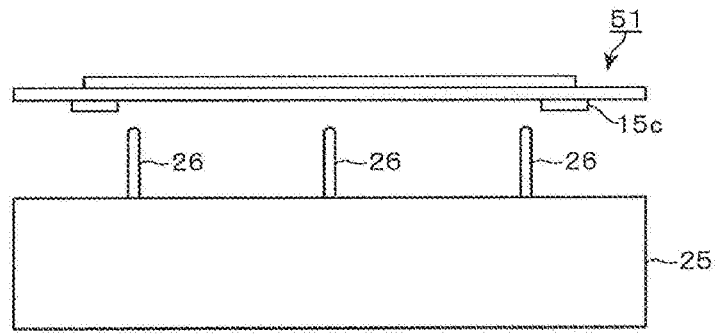
FIG. 10 is a process diagram illustrating processing performed in the substrate processing apparatus.

When first transportation mechanism 15 transports electrostatic chuck 51 onto holding unit 25 of stocker 2, support pins 26 ascend to support the rear surface of electrostatic chuck 51 as shown in FIG. 10. When support portion 15*c* retreats from holding unit 25, support pins 26 descend, such that electrostatic chuck 51 is placed on the surface of holding unit 25. Continuously, first transportation mechanism 15 receives focus ring 52 from rack 24 of stocker 2, and transports received focus ring 52 to rotation stage 31 of alignment chamber 3. As described above, the center of focus ring 52 is detected and transferred to support portion 15*c* so that the center is positioned at a predetermined position of support portion 15*c* of first transportation mechanism 15.

Figure 11:
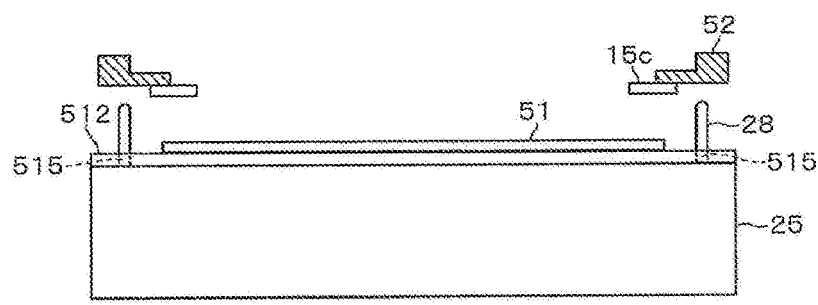
FIG. 11 is a process diagram illustrating processing performed in the substrate processing apparatus.

Continuously, first transportation mechanism 15 transports focus ring 52 onto holding unit 25 of stocker 2, and as shown in FIG. 11, support pins 28 protrude on electrostatic chuck 51 through hole 515 of electrostatic chuck 51 to support the rear surface of focus ring 52. When support portion 15*c* retreats from holding unit 25, support pins 28 descend, such that focus ring 52 is placed on the surface of periphery 512 of electrostatic chuck 51.

Continuously, carrier C is placed in carrier placing table 14 and connected to atmospheric transportation chamber 11. Next, gate door GT and the cover of carrier C are opened, and wafer W within carrier C is carried into alignment chamber 3 through atmospheric transportation chamber 11 by first transportation mechanism 15. As described above, the center position of wafer W is detected. Wafer W is transferred so that the detected center is positioned at a predetermined position of support portion 15c of first transportation mechanism 15.

Figure 12:
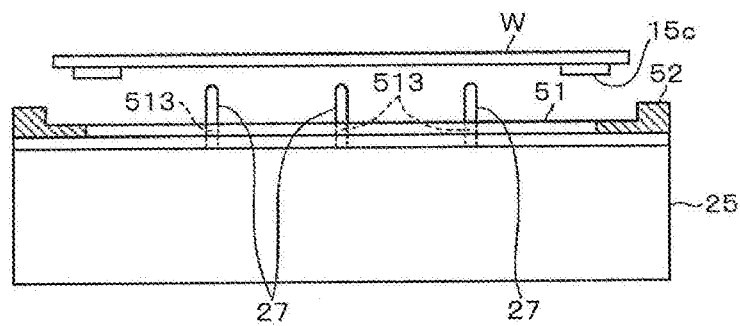
FIG. 12 is a process diagram illustrating processing performed in the substrate processing apparatus.
Figure 13:
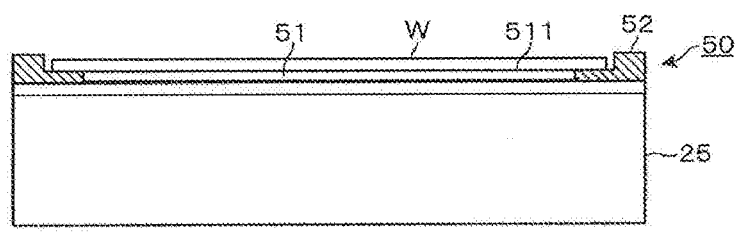
FIG. 13 is a process diagram illustrating processing performed in the substrate processing apparatus.

When support portion 15c of first transportation mechanism 15 transports wafer W onto holding unit 25 of stocker 2, support pins 27 of electrostatic chuck 51 ascend to support the rear surface of wafer W as shown in FIG. 12. When support portion 15c retreats from holding unit 25, support pins 27 descend, such that wafer W is placed on center 511 of electrostatic chuck 51 to form target transport body 50.

Figure 14:
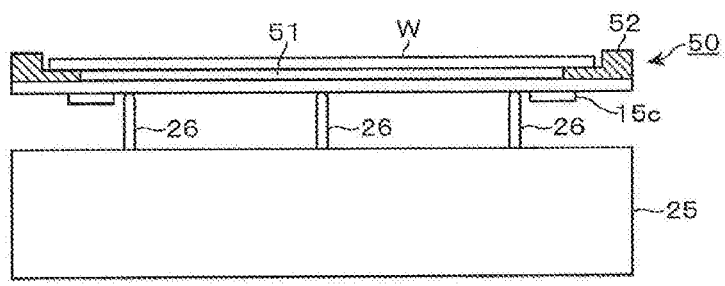
FIG. 14 is a process diagram illustrating processing performed in the substrate processing apparatus.
Figure 15:
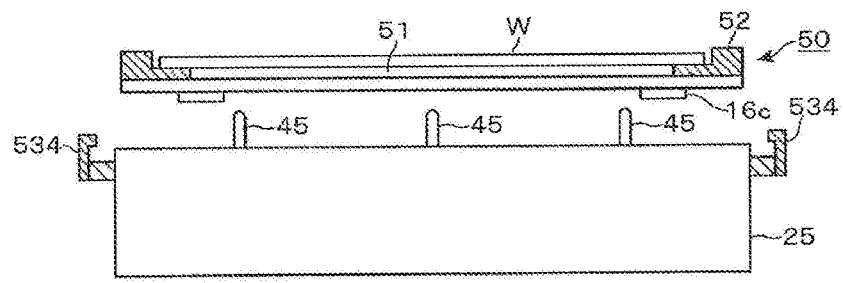
FIG. 15 is a process diagram illustrating processing performed in the substrate processing apparatus.

Continuously, as shown in FIG. 14, support pins 26 push up a rear surface of target transport body 50 to transfer target transport body 50 to first transportation mechanism 15. First transportation mechanism 15 transports target transport body 50 to load lock chamber 12 that is maintained to the air atmosphere. When the inside of the chamber is changed to the vacuum state by adjusting the pressure of load lock chamber 12, support portion 16c of second transportation mechanism 16 receives target transport body 50 and transports received target transport body 50 onto body part 44 of plasma etching module 4 through vacuum transportation chamber 13. As shown in FIG. 15, support pins 45 ascend to support the rear surface of target transport body 50 and thereafter, second transportation mechanism 16 retreats from the inside of plasma etching module 4. Support pins 45 descend, such that target transport body 50 is placed on body part 44 to form placing table 43. Electrostatic chuck 51 of target transport body 50 is interposed between pressing members 534, corresponding electrostatic chuck 51 is fixed to body part 44 by the pressing force, and wafer W is adsorbed and fixed to electrostatic chuck 51 by applying voltage to electrostatic chuck 51.

Figure 16:
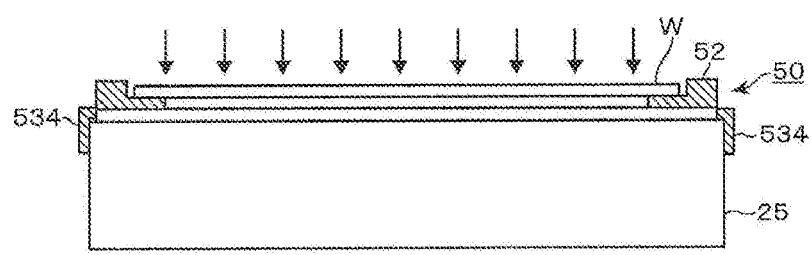
FIG. 16 is a process diagram illustrating processing performed in the substrate processing apparatus.

The inside of processing chamber 41 is maintained to a predetermined vacuum degree and mixed gas composed of processing gas, for example, $C_4F$ gas, CO gas, $O_2$ gas and Ar gas is supplied from upper electrode 42. A high-frequency power is applied to each of upper electrode 42 and placing table 43, the supplied processing gas is made into plasma, and the processing gas is injected into wafer W as indicated by an arrow in FIG. 16 to etch an etched layer, for example, a silicon dioxide ($SiO_2$) layer on the surface of wafer W.

Figure 17:
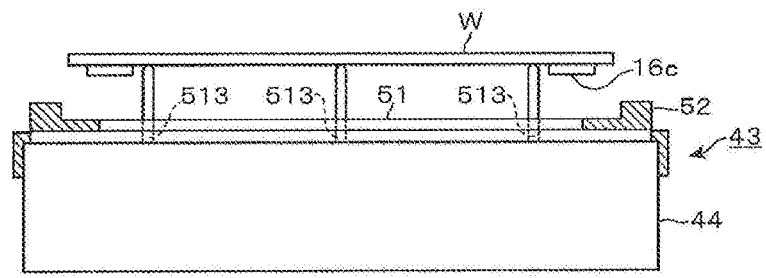
FIG. 17 is a process diagram illustrating processing performed in the substrate processing apparatus.

When etching is performed for a predetermined time, the application of the high-frequency power and the supply of the processing gas stop, the rear surface of wafer W is pushed up by support pins 47 that protrudes through hole 513 of electrostatic chuck 51, and wafer W is transferred to support portion 16c of second transportation mechanism 16 (FIG. 17). As wafer W is carried into load lock chamber 12 that is maintained to the vacuum state, the pressure of load lock chamber 12 rises to be in the air atmosphere. Wafer W is transferred to first transportation mechanism 15, and returned to carrier C.

Subsequent wafer W is extracted from carrier C, and subsequent wafer W is transported to alignment chamber 3 similar to wafer W transported as target transport body 50, and is transferred to first transportation mechanism 15 with the center position thereof adjusted. Wafer W is transported to plasma etching module 4 through not stocker 2 but load lock chamber 12 and vacuum transportation chamber 13 to be etched as described above. After the processing, the processed wafer is returned to carrier C similar to preceding wafer W.

Figure 18:
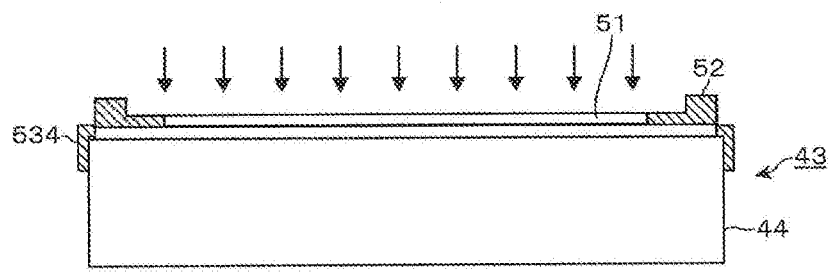
FIG. 18 is a process diagram illustrating processing performed in the substrate processing apparatus.

For example, when a predetermined number of wafers W are processed in plasma etching module 4 and then wafer W is carried out, for example, $O_2$ gas as cleaning gas is supplied from upper electrode 42. The high-frequency power is applied to each of upper electrode 42 and placing table 43, such that the supplied cleaning gas is made into plasma to be injected into placing table 43 (FIG. 18). Sediment deposited on placing table 43 or an inner wall of processing chamber 41 is removed by the plasma, and when plasma is generated for a predetermined time, the application of the high-frequency power and the supply of the cleaning gas halt. The cleaning is performed, for example, before processing a subsequent lot after processing a predetermined lot.

Figure 19:
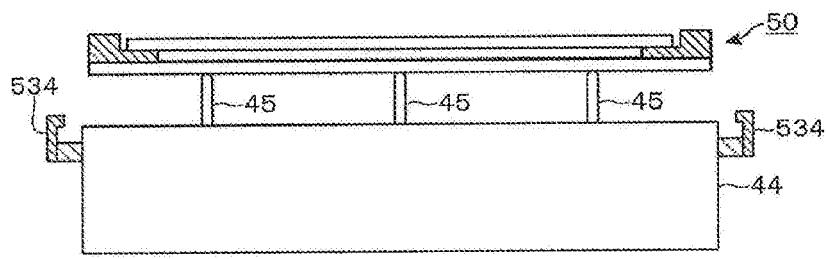
FIG. 19 is a process diagram illustrating processing performed in the substrate processing apparatus.

When, for example, a predetermined number of wafers W are processed, fixation of electrostatic chuck 51 to body part 44 by pressing member 534 is released, and support pins 45 push up target transport body 50 as shown in FIG. 19. Target transport body 50 is transferred to atmospheric transportation chamber 12 through vacuum transportation chamber 13 and load lock chamber 12, and placed in holding unit 25 of stocker 2, and thereafter, disassembled into wafer W, electrostatic chuck 51 and focus ring 52 in a reverse operation to the operation while being assembled. Wafer W is returned to carrier C, and electrostatic chuck 51 and focus ring 52 are returned to rack 24.

Thereafter, new electrostatic chuck 51 and focus ring 52 that are held in stocker 2 are transported to holding unit 25, and integrated with wafer W which is newly carried into the apparatus to configure target transport body 50, and transported to plasma etching module 4, such that the processing by plasma etching module 4 is restarted. Electrostatic chuck 51 and focus ring 52 in plasma etching module 4 is replaced, for example, before processing a subsequent lot after processing a predetermined lot as in the cleaning. While the processing is performed by new electrostatic chuck 51 and focus ring 52 as described above, a user verifies shapes of electrostatic chuck 51 and focus ring 52 returned to stocker 2 from plasma etching module 4, and replaces electrostatic chuck 51 and focus ring 52 as necessary.

According to substrate processing apparatus 1, electrostatic chuck 51 and focus ring 52 are configured to be attachable to/detachable from placing table 43 of plasma etching module 4, and when electrostatic chuck 51 and focus ring 52 are not used, electrostatic chuck 51 and focus ring 52 are transported to stocker 2 in the atmospheric environment. Accordingly, since the inside of processing chamber 41 of plasma etching module 4 needs not be opened to the atmosphere in order to verify the surface state of electrostatic chuck 51 and focus ring 52, a throughput of substrate processing apparatus 1 can be prevented from deteriorating. Since electrostatic chuck 51 and focus ring 52 are carried out to the outside of processing chamber 41, the surface state can be easily verified. As a result, since a replacement time can be precisely determined by performing a precise shape management, electrostatic chuck 51 and focus ring 52 are prevented from being used while the shapes thereof are out of an allowable level, and as a result, the etching characteristic of wafer W can be prevented from deteriorating.

In the above example, wafer W, electrostatic chuck 51 and focus ring 52 are individually transported to plasma etching module 4 to be etched. However, as described above, when wafer W, electrostatic chuck 51 and focus ring 52 are collectively transported as target transport body 50, the number of operation processes of first transportation mechanism 15 and second transportation mechanism 16 decreases, and the number of times of replacement in the atmosphere of load lock chamber 12 decreases to thereby improve the throughput.

In the above example, transportation frequencies of electrostatic chuck 51 and focus ring 52 may be set to be different from each other. For example, a support pins that push up focus ring 52 corresponding to support pins 28 of stocker 2, independently from electrostatic chuck 51 is installed in placing table 43 of plasma etching module 4. After a predetermined number of wafers W are processed, only focus ring 52 is pushed up while electrostatic chuck 51 is fixed to body part 44 by the support pins, and thus, transferred to second transportation mechanism 16, such that focus ring 52 is returned to stocker 2. New focus ring 52 is transported from stocker 2 to plasma etching module 4, and transferred to the support pins. After a predetermined number of wafers W are processed, target transport body 50 is carried out from plasma etching module 4 as described above. As such, since the number of alignment times in alignment chamber 3 or the operation process for disassembling target transport body 50 in first transportation mechanism 15 may be suppressed by individually setting the transportation frequencies of electrostatic chuck 51 and focus ring 52, the throughput can be improved.

In the above example, instead of the configuration in which the inside of stocker 2 may be seen with naked eyes, a sensor for detecting the shapes of electrostatic chuck 51 and focus ring 52 may be installed in stocker 2. Since the sensor is installed outside processing chamber 41 of plasma etching module 4, the sensor is easily installed without interrupting plasma etching within corresponding processing chamber 41. As the sensor, a sensor using optical interference, atomic force, electron rays, X rays or electromagnetic force may be installed. A camera is installed within case 21 of stocker 2, and a photographed image is configured to be displayed on a display unit constituting control unit 100, and for example, the user may judge the replacement time on the basis of the image. The camera is also installed outside processing chamber 41, and thus, is easily installed, as in the sensor.

The parts such as electrostatic chuck 5 and focus ring 52 have appropriate shapes or states according to a processing condition, but electrostatic chuck 51 and focus ring 52 having a shape or a state specialized for each processing are received in stocker 2, and whenever the processing condition such as gas supplied to processing chamber 41 or pressure in the processing chamber is changed, electrostatic chuck 51 and focus ring 52 may be selected according to the processing condition to be transported to plasma etching module 4. Therefore, a better etching characteristic than that of the related art can be acquired. In detail, for example, focus rings 52 having outer peripheries 522 of which heights, diameter sizes or materials are different from each other are stored in the stocker. The position of rack 24 where each focus ring 52 is placed, and the processing condition are stored in a memory constituting control unit 100 to correspond to each other. When the user designates the processing condition with respect to the lot of the wafer, first transportation mechanism 15 receives focus ring 52 of rack 24 corresponding to the processing condition to form target transport body 50 as described above, such that the processing in plasma etching module 4 is performed.

Modified Example of First Exemplary Embodiment

In the above exemplary embodiment, electrostatic chuck 51 and focus ring 52 are separated at the time of receiving stocker 2. However, electrostatic chuck 51 and focus ring 52 may be joined to each other in advance to be integrated as a surface part 61, and surface part 61 may be stored in rack 24 of stocker 2. Even in this case, surface part 61 is integrated with wafer W on holding unit 25 in the same manner as above. For example, a notch (not shown) corresponding to notch 516 of electrostatic chuck 51 in the first exemplary embodiment is provided on an outer periphery of surface part 61. When surface part 61 is transferred to first transportation mechanism 15 in alignment chamber 3, a direction of surface part 61 is adjusted by the notch.

Figure 20:
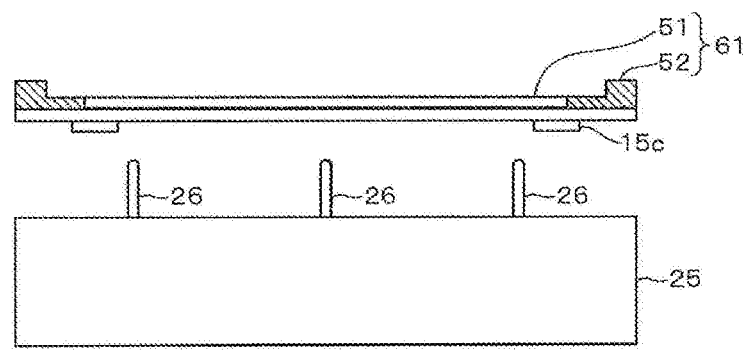
FIG. 20 is a process diagram illustrating an example of another processing in a substrate processing apparatus.
Figure 21:
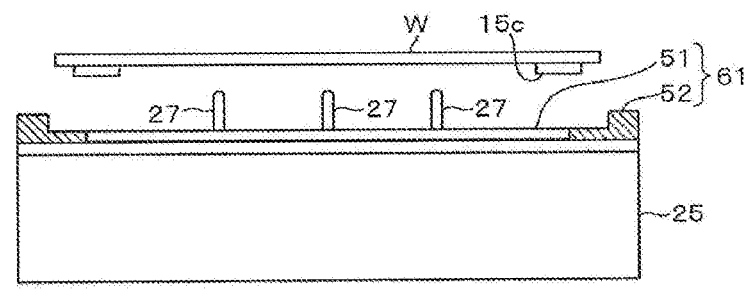
FIG. 21 is a process diagram illustrating an example of another processing in a substrate processing apparatus.
Figure 22:
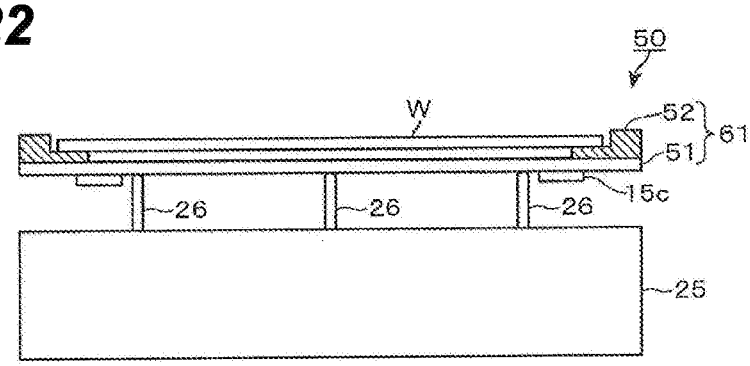
FIG. 22 is a process diagram illustrating an example of another processing in a substrate processing apparatus.

When surface part 61 (FIG. 20) aligned with respect to support portion 15c of first transportation mechanism 15 is transferred to holding unit 25 of stocker 2 through support pins 26 in alignment chamber 3, and thereafter, wafer W is transported to stocker 2 (FIG. 21) to form target transport body 50 as in the first exemplary embodiment. Target transport body 50 is transferred to support portion 15c (FIG. 22), and transported to plasma etching module 4 as in the first exemplary embodiment. After the processing in plasma etching module 4, target transport body 50 is returned to holding unit 25 as in the first exemplary embodiment. Wafer W is separated from surface part 61 and returned to carrier C, and surface part 61 is returned to rack 24 of stocker 2. In the modified example, since the number of operation times of first transportation mechanism 15 performed to form target transport body 50, and the number of alignment times of alignment chamber 3 may be smaller than the first exemplary embodiment, a higher throughput can be acquired.

Second Exemplary Embodiment

Figure 23:
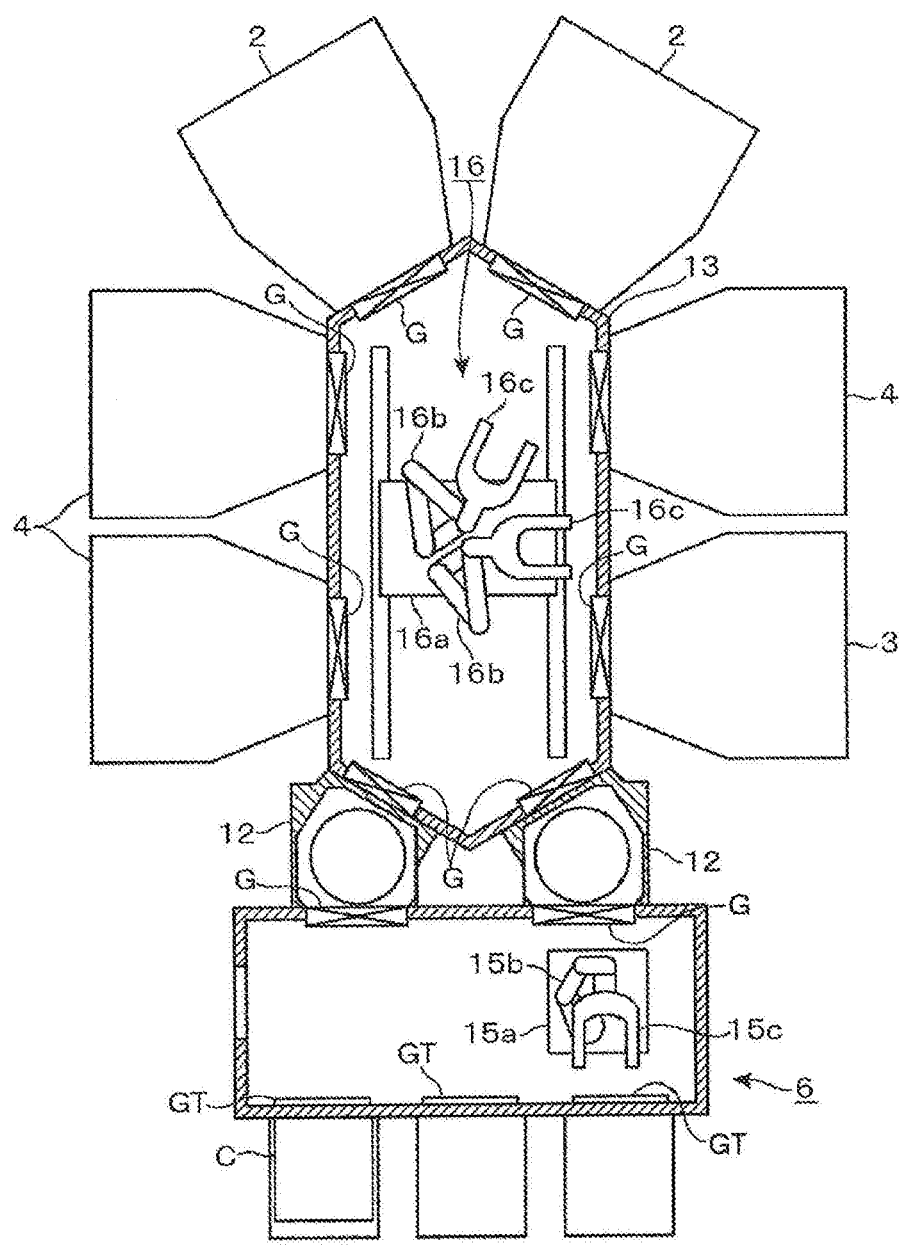
FIG. 23 is a plan view illustrating a configuration of another substrate processing apparatus.

As the second exemplary embodiment, an example in which stocker 2 is connected to vacuum transportation chamber 13 is shown in FIG. 23. Two stockers 2 are installed in a substrate processing apparatus 6 of FIG. 23. Each stocker 2 is configured similar to the first exemplary embodiment, but each stocker 2 has gate valve (division valve) G similar to plasma etching module 4 instead of shutter 23. An exhaust hole that maintains the vacuum state by vacuum-exhausting the inside of corresponding case 21 and an air supply hole that supplies air to restore the inside of case 21 from the vacuum state to the atmospheric environment are installed in case 21.

In the second exemplary embodiment, alignment chamber 3 is connected to and installed in vacuum transportation chamber 13. Alignment chamber 3 is configured substantially similar to the first exemplary embodiment, but the inside thereof is maintained in the vacuum state. Rotation stage 31 is configured to electrostatically adsorb electrostatic chuck 51 or focus ring 52 instead of vacuum-adsorbing electrostatic chuck 51 or focus ring 52 to adsorb electrostatic chuck 51 or focus ring 52 in the vacuum state. However, instead of the electrostatic adsorption, position displacement by centrifugal force when rotation stage 31 rotates may be prevented by coating the entirety or a part of the surface of rotation stage 31 with a material having a high friction coefficient such as, for example, rubber, for each member of focus ring 52, electrostatic chuck 51 and wafer W. Instead of installing a mechanism or member for preventing the position displacement thereof, rotation stage 31 may be rotated at a low speed so as to prevent the position displacement by the centrifugal force.

The processing in the second exemplary embodiment is similar to the processing in the first exemplary embodiment except that the transportation path of electrostatic chuck 51 and focus ring 52 is formed in a sequence of stocker 2, alignment chamber 3 and stocker 2, that wafer W transported from carrier C is transferred to load lock chamber 12, vacuum transportation chamber 13, alignment chamber 3 and stocker 2 in sequence, and that a transportation path of target transport body 50 formed in stocker 2 is formed in a sequence of vacuum transportation chamber 13 and plasma etching module 4.

In substrate processing apparatus 6 of the second exemplary embodiment, the shapes of electrostatic chuck 51 and focus ring 52 therein are verified or electrostatic chuck 51 and focus ring 52 are replaced at two stockers 2 that are installed, one at a time. While gate valve G of one stocker 2 is closed to suppress an influence exerted to a vacuum degree of each of other chambers, vacuum exhaustion within case 21 of this stocker 2 stops, and at the same time, the atmosphere is supplied to case 21 to restore the inside of case 21 to the atmospheric environment. The verification of the shapes or the replacement is performed by separating side wall 21a of case 21. Thereafter, the inside of case 21 is vacuum-exhausted again to be restored to the atmospheric environment. As described above, while electrostatic chuck 51 and focus ring 52 are verified and replaced in one stocker 2, the processing is performed using electrostatic chuck 51 and focus ring 52 in the other stocker 2.

In the second exemplary embodiment, since electrostatic chuck 51 and focus ring 52 are carried out from the inside of plasma etching module 4 to verify the shapes thereof, the inside of processing chamber 41 of plasma etching module 4 needs not be opened to the atmosphere similar to the first exemplary embodiment. Therefore, production efficiency of the apparatus can be prevented from deteriorating. By installing two stockers 2, while one stocker 2 is opened to the atmosphere, formation and transportation of target transport body 50 are continuously performed in the other stocker 2 to thereby prevent the production efficiency of the apparatus from deteriorating more certainly. However, even a case in which only one stocker 2 is connected to vacuum transportation chamber 13 is effective because the shape verification and the replacement can be performed by opening the inside of stocker 2 to the atmosphere while the processing is performed in plasma etching module 4.

However, the configurations shown in the respective exemplary embodiments may be used in combination with each other. For example, even in the second exemplary embodiment, various sensors or cameras may be installed in stocker 2 and electrostatic chuck 51 and focus ring 52 may be integrated and stored in stocker 2. One stocker 2 may be installed in atmospheric transportation chamber 11, and further, the other stocker 2 may be installed to be connected to vacuum transportation chamber 13.

Figure 24:
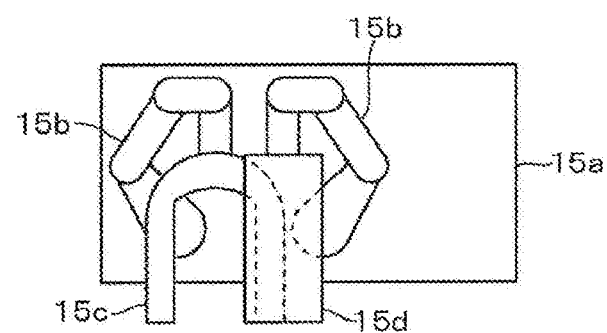
FIG. 24 is a plan view illustrating an example of another transportation mechanism of a substrate processing apparatus.

Herein, first transportation mechanism 15 and second transportation mechanism 16 correspond to a transportation mechanism. The transportation mechanism may be divided and installed in each chamber to transport each member and move among the respective chambers to transport each member. In regard to the support portion of the transportation mechanism of each exemplary embodiment, the support portion transporting target transport body 50 and the support portion transporting electrostatic chuck 51, focus ring 52 and wafer W may be configured to be different from each other. FIG. 24 illustrates another configuration example of first transportation mechanism 15 in the first exemplary embodiment and in this example, two multi-link arms 15b are installed in base portion 15a. Support portion 15c described above is installed at a front end of one arm 15b, and a support portion 15d is installed at a front end of the other arm 15b. Support portion 15d is formed in a rectangular plate shape. Support portion 15c transports electrostatic chuck 5, focus ring 52 and wafer W similar to the first exemplary embodiment. Support portion 15d transports target transport body 50.

Figure 25:
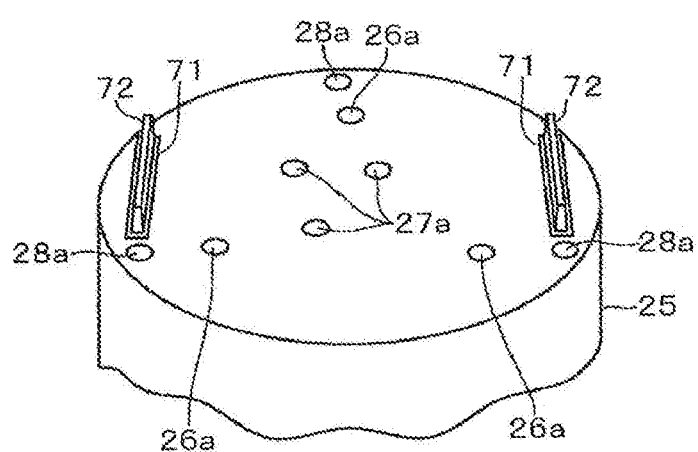
FIG. 25 is a perspective view illustrating a placing table corresponding to the transportation mechanism.
Figure 26:
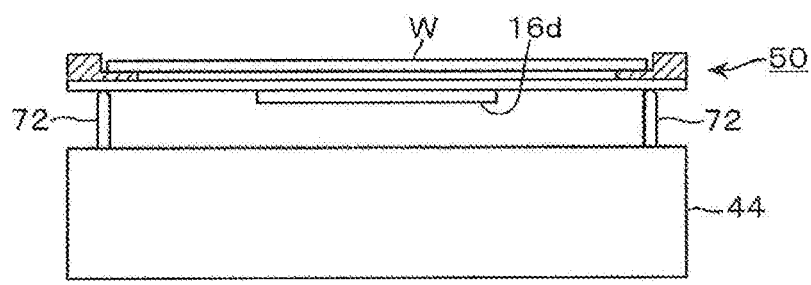
FIG. 26 is a process diagram illustrating a transportation example in the transportation mechanism.

A transfer mechanism corresponding to support portion 15d may be installed even in holding unit 25 of stocker 2. FIG. 25 illustrates holding unit 25 and two slits 71 that are formed in parallel to each other are provided on the surface of holding unit 25. Linear members 72 and 72 formed along slits 71 are installed to be elevatable and protrude or are dented on the surface of holding unit 25. As described above, after target transport body 50 is formed in holding unit 25, linear member 72 ascends to push up target transport body 50 and transfer transported body 50 to support portion 15d as shown in FIG. 26. Even when target transport body 50 restored from plasma etching module 4 is transferred to holding unit 25, support portion 15d and linear member 72 are used as described above.

Target transport body 50, wafer W, electrostatic chuck 51 and focus ring 52 are transported by support portions 15c and 15d having different shapes, respectively, in order to prevent a transported object from falling from the support portion by using a support portion having an appropriate shape according to a shape or a weight of the transported object. Even in second transportation mechanism 16, one side of two support portions 16c that are installed is configured in the same shape as support portion 15d to be configured as a dedicated support portion for transporting target transport body 50.

In the first exemplary embodiment, vicuna transportation chamber 13 may not be installed and plasma etching module 4 may be connected directly to load lock chamber 12. In this case, for example, the transportation mechanism such as first transportation mechanism 1S is installed in load lock chamber 12 to transfer wafer W between atmospheric transportation chamber 11 and plasma etching module 4. The member stored in stocker 2 is not limited to electrostatic chuck 51 and focus ring 52. Although not shown, a protection component is installed in placing table 43 to prevent the outer periphery thereof from being etched. For example, the corresponding component may be configured to be attachable to/detachable from placing table 43 and may be stored in stocker 2. Stocker 2 may be installed in load lock chamber 12. A module connected to vacuum transportation chamber 13 is not limited to the plasma etching module and for example, may be a film forming module that forms a film on wafer W by making the processing gas into plasma.

Figure 27:
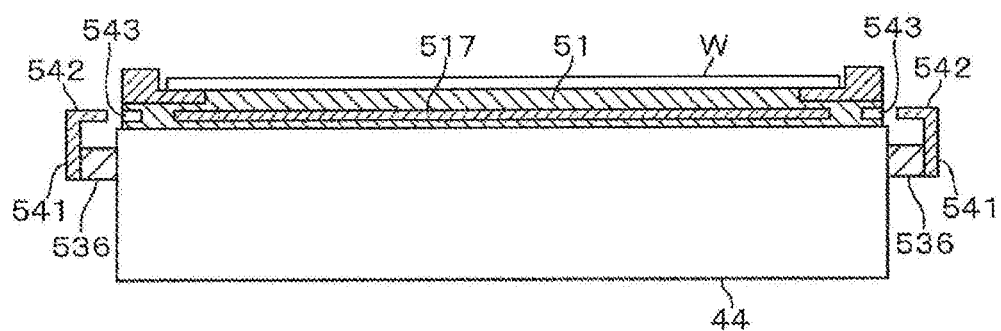
FIG. 27 is a longitudinal side view of another placing table installed in the plasma etching module.
Figure 28:
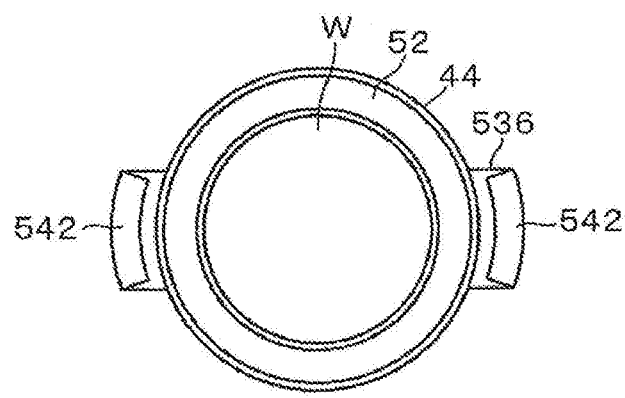
FIG. 28 is a plan view of the placing table.
Figure 29:
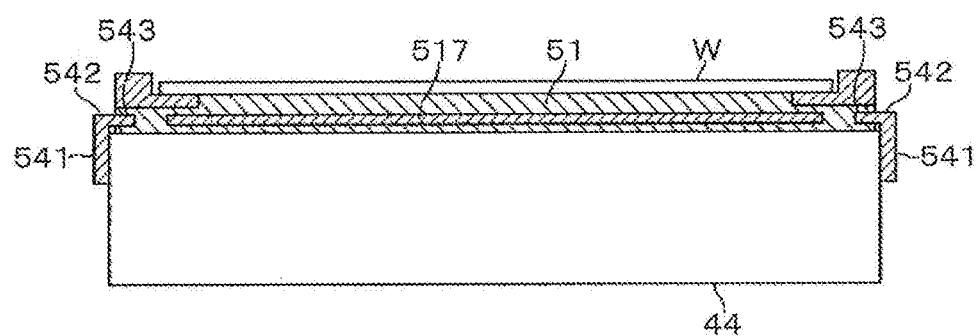
FIG. 29 is a longitudinal side view of the placing table.
Figure 30:
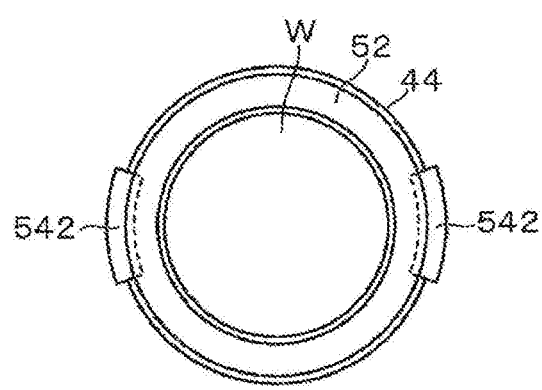
FIG. 30 is a plan view of the placing table.

Next, another method for fixing electrostatic chuck 51 in plasma etching module 4 will be described. In an example shown in FIGS. 27 and 28, a vertical plate 541 is installed in support member 536 of body part 44 of plasma etching module 4 and a horizontal insertion plate 542 is installed in an upper part of vertical plate 541 to extend toward body part 44. A groove portion 534 is provided on a side circumference of electrostatic chuck 51 to correspond to insertion plate 542. When target transport body 50 is placed in body part 44, an end portion of insertion plate 542 is inserted into groove portion 543, such that electrostatic chuck 51 is fixed to body part 44 as shown in FIGS. 29 and 30.

Figure 31:
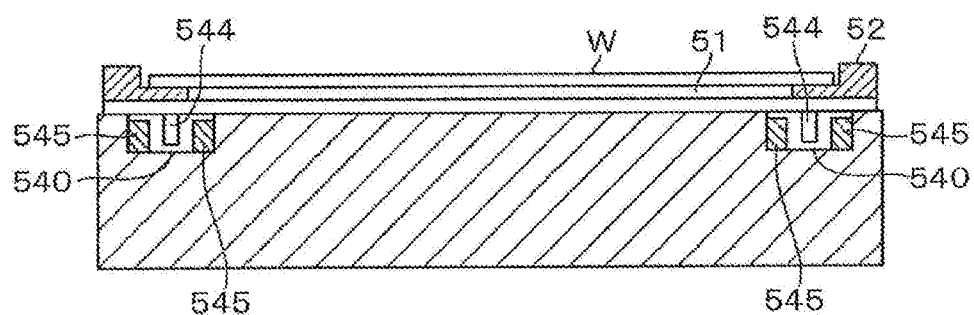
FIG. 31 is a longitudinal side view of yet another placing table.
Figure 32:
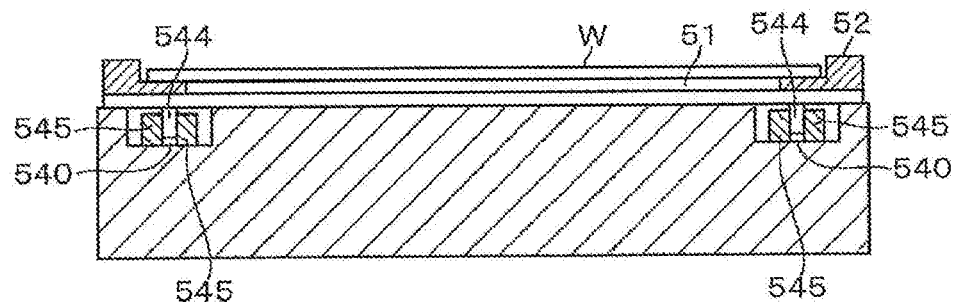
FIG. 32 is a longitudinal side view of the placing table.

FIG. 31 illustrates body part 44 where a concave portion 540 is provided on the surface thereof. A bar 544 that extends downward is installed on the bottom of electrostatic chuck 51 and when target transport body 50 is placed in body part 44, bar 544 is configured to enter concave portion 540. Pressing members 545 that are opposite to each other with bar 544 interposed therebetween are installed in each concave portion 540 and pressing members 545 move toward the center of bar 544 to press bar 544, such that electrostatic chuck 51 is fixed to body part 44.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:
an atmospheric transportation chamber that operates in an atmospheric environment and includes a first robot;
a vacuum transportation chamber that operates under a vacuum environment and includes a second robot;
a load lock chamber provided between the atmospheric transportation chamber and the vacuum transportation chamber and configured to controllably change between the atmospheric environment and the vacuumen environment,
a processing chamber connected to the vacuum transportation chamber and configured to perform processing of a substrate under vacuum;
a stocker directly connected to the vacuum transportation chamber and configured to store a surface part therein; and
an alignment chamber connected to the vacuum transportation chamber and configured to detect a position of the surface part, wherein
the second robot is configured to transport the surface part between the stocker and the processing chamber via the vacuum transportation chamber.

2. The substrate processing apparatus of claim 1, wherein a state of the stocker is controllably changeable between an atmospheric environment and a vacuum environment.

3. The substrate processing apparatus of claim 1, wherein the stocker is located on an opposite side of the vacuum transportation chamber from the load lock chamber and at a distance from the load lock chamber that is further than a distance from the load lock chamber to the processing chamber.

4. The substrate processing apparatus of claim 1, wherein an opening of the stocker substantially faces an opening of the load lock chamber.

5. The substrate processing apparatus of claim 1, wherein the second robot is movable in a substantially horizontal direction within the vacuum transportation chamber.

6. The substrate processing apparatus of claim 1, wherein the stocker includes a structure having a surface that is sized to hold the surface part thereon.

7. The substrate processing apparatus of claim 1, wherein the stocker comprises a case that includes an exhaust opening and exhaust valve that maintains the vacuum environment by vacuum-exhausting an interior of the case.

8. The substrate processing apparatus of claim 1, wherein the stocker comprises a sensor configured to detect a presence of a focus ring within the stocker.

9. The substrate processing apparatus of claim 1, wherein the stocker comprises a camera configured to photographically detect a presence of the surface part within the stocker.

10. The substrate processing apparatus of claim 1, wherein the second robot is configured to exchange a focus ring that was used in the processing chamber with a new focus ring from the stocker.

11. The substrate processing apparatus of claim 1, wherein the second robot is configured to exchange a focus ring and an electrostatic chuck from the processing chamber with a new focus ring and another electrostatic chuck from the stocker.

12. The substrate processing apparatus of claim 1, wherein the alignment chamber is maintained in a vacuum environment.

13. The substrate processing apparatus of claim 12, wherein the stocker is maintained in the vacuum environment.

14. The substrate processing apparatus of claim 1, wherein the alignment chamber is configured to electrostatically hold the surface part, the surface part including at least one of a focus ring or an electrostatic chuck.

15. The substrate processing apparatus of claim 1, wherein the alignment chamber includes a stage coated with a material having a high friction coefficient that inhibits displacement of the surface part during a rotation of the stage.

16. The substrate processing apparatus of claim 1, wherein the surface part includes a focus ring and an electrostatic chuck, and the second robot is configured to transfer the focus ring from the processing chamber to the stocker with the electrostatic chuck, or separate from the electrostatic chuck in another transportation operation.

17. The substrate processing apparatus of claim 1, further comprising:
a controller programmed to control the second robot to transfer the surface part from the stocker to the alignment chamber, wherein
the alignment chamber includes a sensor that detects a position of the surface part.

18. The substrate processing apparatus of claim 1, further comprising:
another stocker connected to the vacuum transportation chamber.

19. The substrate processing apparatus of claim 1, wherein the surface part includes a focus ring and an electrostatic chuck, and the stocker is configured to store the focus ring and the electrostatic chuck as an integrated unit.

20. The substrate processing apparatus of claim 1, wherein the surface part includes an electrostatic chuck and a focus ring, and the second robot includes an arm that individually supports and transports the electrostatic chuck and the focus ring in the vacuum transportation chamber during different transport operations.

21. The substrate processing apparatus of claim 20, wherein the arm of the second robot separately supports and transports the substrate in a different transport operation than the transport operations that transport the focus ring.

22. The substrate processing apparatus of claim 1, wherein
- the surface part includes an electrostatic chuck and a focus ring, and
- the second robot includes an arm that collectively removes the electrostatic chuck with focus ring from the processing chamber.

23. The substrate processing apparatus of claim 1, wherein
- the surface part includes two components, and
- the processing chamber includes a support with support pins that contact a rear surface of a first component of the two components so as to controllably raise and lower the two components while a second component of the two components rests on the first component.

24. The substrate processing apparatus of claim 23, wherein
- the first component is an electrostatic chuck.

\* \* \* \* \*